(12) United States Patent
Kimura et al.

(10) Patent No.: US 9,970,668 B2
(45) Date of Patent: May 15, 2018

(54) INTEGRATED TYPE AIR CONDITIONING DEVICE

(71) Applicants: DENSO CORPORATION, Kariya, Aichi-pref. (JP); DENSO AIRCOOL CORPORATION, Azumino-Shi, Nagano-Pref. (JP)

(72) Inventors: Naruhide Kimura, Kariya (JP); Shoichi Yamaguchi, Azumino (JP); Junichi Ohki, Azumino (JP)

(73) Assignees: DENSO CORPORATION, Kariya, Aichi-pref. (JP); DENSO AIRCOOL CORPORATION, Azumino-shi, Nagano-pref. (JP)

( * ) Notice: Subject to any disclaimer, the term of this patent is extended or adjusted under 35 U.S.C. 154(b) by 0 days. days.

(21) Appl. No.: 15/278,158

(22) Filed: Sep. 28, 2016

(65) Prior Publication Data
US 2017/0227242 A1      Aug. 10, 2017

(30) Foreign Application Priority Data

Feb. 5, 2016   (JP) .................................. 2016-020487

(51) Int. Cl.
*F24F 5/00* (2006.01)
*F24F 13/14* (2006.01)
(Continued)

(52) U.S. Cl.
CPC ............ *F24F 5/0007* (2013.01); *F24F 1/022* (2013.01); *F24F 5/001* (2013.01); *F24F 5/0035* (2013.01);
(Continued)

(58) Field of Classification Search
CPC ........ F24F 5/001; F24F 5/0035; F24F 1/0014; F24F 1/022
See application file for complete search history.

(56) References Cited

U.S. PATENT DOCUMENTS 4,827,733 A  *  5/1989  Dinh ....................... F24F 1/022
                                                             62/119
2001/0042614 A1   11/2001  Okamoto

FOREIGN PATENT DOCUMENTS

JP        3990490 B2    10/2007
JP        4178719 B2    11/2008
(Continued)

*Primary Examiner* — Cassey D Bauer
(74) *Attorney, Agent, or Firm* — Harness, Dickey & Pierce, P.L.C.

(57) ABSTRACT

An integrated type air conditioning device includes a first refrigeration cycle that is an evaporative cooling type, a second refrigeration cycle that is a vapor-compression type, a blower device, and a housing accommodating the first and second cycles. The first refrigeration cycle includes an evaporation heat exchanger, a condensation heat exchanger, and a first refrigerant pipe. The second refrigeration cycle includes a compressor, a condenser, a decompression device, an evaporator, and a second refrigerant pipe. The housing is partitioned into an interior air passage and an exterior air passage. The evaporation heat exchanger and the evaporator are positioned in the interior air passage, the evaporation heat exchanger being located upstream of the evaporator with respect to an interior airflow in the interior air passage. The blower device is disposed in the interior air passage and is driven to generate the interior airflow in the interior air passage.

7 Claims, 7 Drawing Sheets

(51) Int. Cl.
*F24F 13/20* (2006.01)
*F24F 1/02* (2011.01)
*H05K 7/20* (2006.01)

(52) U.S. Cl.
CPC .............. *F24F 13/14* (2013.01); *F24F 13/20* (2013.01); *H05K 7/20309* (2013.01); *H05K 7/20318* (2013.01); *H05K 7/20354* (2013.01)

(56) References Cited

FOREIGN PATENT DOCUMENTS

| | | |
|---|---|---|
| JP | 3197279 U | 4/2015 |
| JP | 2015-200433 A | 11/2015 |

* cited by examiner

INTEGRATED TYPE AIR CONDITIONING DEVICE

CROSS REFERENCE TO RELATED APPLICATION

This application is based on and incorporates herein by reference Japanese Patent Application No. 2016-020487 filed on Feb. 5, 2016.

TECHNICAL FIELD

The present disclosure relates to an integrated type air conditioning device.

BACKGROUND

A technology is known, in which an evaporative cooling device and an air conditioner are used together for cooling an interior of a facility (e.g. sealed casing) accommodating a heat generating element such as an electronic device in order to reduce a load on the air conditioner and a running cost of the air conditioner. For example, Patent Document 1 (JP 3990490 B2) discloses a technology, in which an air conditioning load on an air conditioner can be reduced by radiating heat in an interior to an exterior via cooling a high temperature heat radiated from a device in the interior by an evaporative cooling device.

However, the interior of a sealed casing may not be cooled below a temperature of an exterior air by evaporative cooling, and in principle, it may be difficult for the evaporative cooling device to cool the interior below a temperature of a refrigerant in the evaporative cooling device. The temperature of the refrigerant in the evaporative cooling device is approximately equal to a sum of a temperature of the exterior and the temperature of the interior divided by two. Since the temperature of the interior of the sealed casing may not be cooled to an operation guaranteed temperature of the device disposed in the interior under a situation where the temperature of the exterior is above 30° C., an air conditioning device that is vapor compression type such as an air conditioner is necessary besides the evaporative cooling device, and a space for the air conditioning device is needed. Moreover, since the evaporative cooling device and the vapor-compression type air conditioner cool the interior air of the sealed casing, those are affected by a position of the heat generating element, for example, and accordingly a cooling efficiency may be low.

SUMMARY

It is an objective of the present disclosure to provide an integrated type air conditioning device being capable of cooling an interior effectively regardless of a temperature of an exterior air.

According to an aspect of the present disclosure, an integrated type air conditioning device for cooling an interior of a room includes: a first refrigeration cycle that is an evaporative cooling type; a second refrigeration cycle that is a vapor-compression type; a blower device enhancing heat exchanges in the first refrigeration cycle and the second refrigeration cycle; and a housing accommodating the first refrigeration cycle and the second refrigeration cycle. The first refrigeration cycle includes: an evaporation heat exchanger evaporating a refrigerant therein by receiving heat of a high temperature air; a condensation heat exchanger condensing the refrigerant therein while radiating heat to a low temperature air; and a first refrigerant pipe connecting together the evaporation heat exchanger and the condensation heat exchanger to form a refrigerant circuit in which the refrigerant circulates. The second refrigeration cycle includes: a compressor compressing and circulating a gas refrigerant in the second refrigeration cycle; a condenser condensing the gas refrigerant discharged from the compressor; a decompression device decompressing and expanding the refrigerant condensed by the condenser; an evaporator evaporating the refrigerant decompressed by the decompression device; and a second refrigerant pipe connecting together the compressor, the condenser, the decompression device, and the evaporator to form a refrigerant circuit in which the refrigerant circulates. The housing is partitioned into an interior air passage and an exterior air passage, the interior air passage taking in an air from the interior of the room and discharging the air to the interior of the room, the exterior air passage taking in an air from an exterior of the room and discharging the air to the exterior of the room. The evaporation heat exchanger of the first refrigeration cycle and the evaporator of the second refrigeration cycle are positioned in the interior air passage, the evaporation heat exchanger being located upstream of the evaporator with respect to an interior airflow in the interior air passage. The blower device is disposed in the interior air passage and is driven to generate the interior airflow in the interior air passage.

According to this aspect, the interior air is cooled by using the evaporative cooling type first refrigeration cycle is in which an electricity consumption is relatively low first, and subsequently a deficiency of a cooling capacity of the first refrigeration cycle, which is caused by a difference between a temperature of the exterior air and a temperature of the refrigerant in the first refrigeration cycle, is covered by using the second refrigeration cycle that is vapor-compression type, and accordingly the interior air can be cooled efficiently regardless of the temperature of the exterior air.

According to the present embodiment, an integrated type air conditioning device being capable of cooling an interior effectively regardless of a temperature of an exterior air can be provided.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
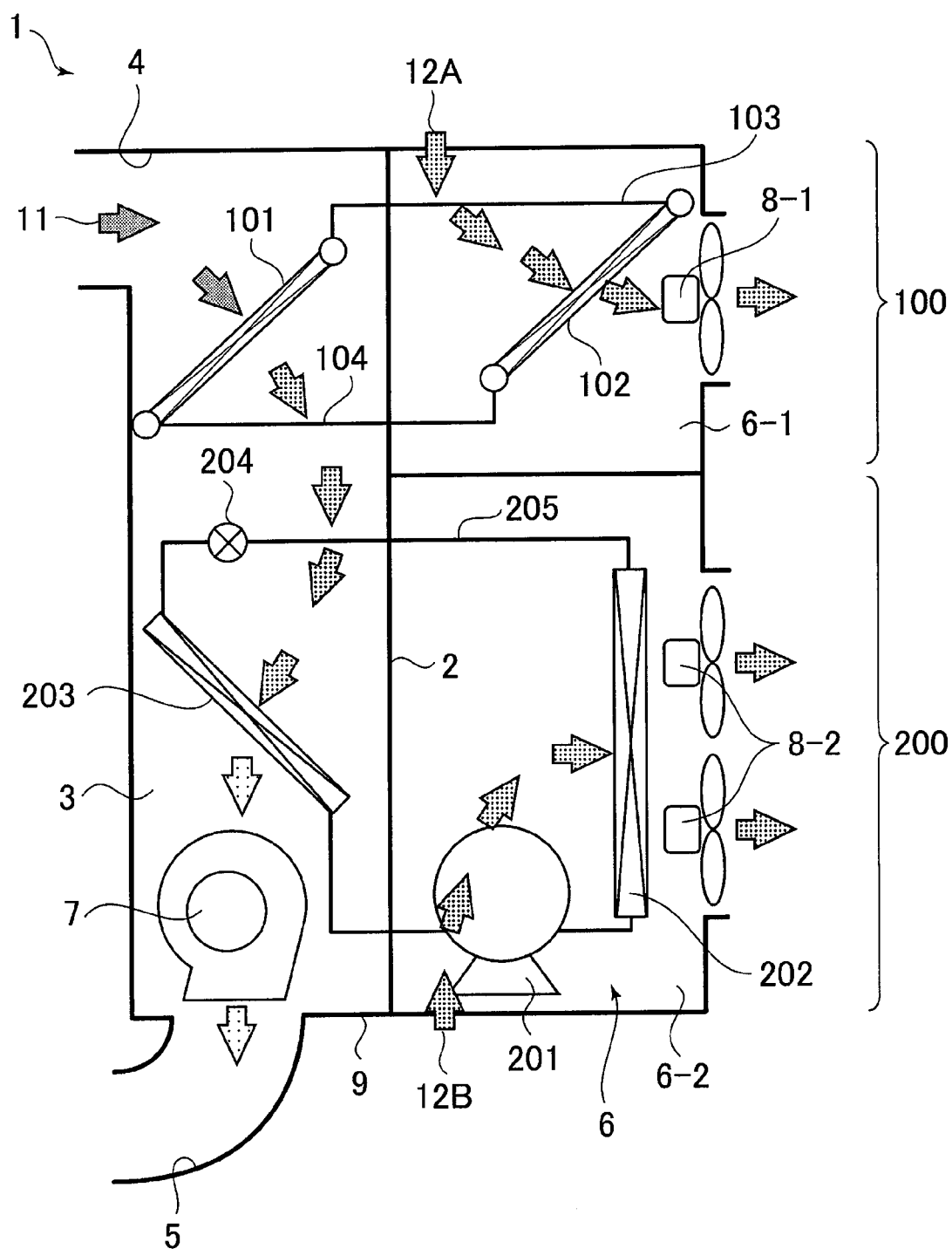
FIG. 1 is a diagram illustrating an integrated type air conditioning device according to an embodiment of the present disclosure.

Embodiments of the present disclosure will be described hereinafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Embodiment

An integrated type air conditioning device 1 according to an embodiment of the present disclosure will be described below referring to FIG. 1. The integrated type air conditioning device 1 is a device for cooling an interior of a facility. The integrated type air conditioning device 1 includes at least one first refrigeration cycle 100 that is evaporative cooling type, at least one second refrigeration cycle 200 that is vapor-compression type, and a housing 9 accommodating the first refrigeration cycle 100 and the second refrigeration cycle 200. In an example shown in FIG. 1, the housing 9 accommodates therein one first refrigeration cycle 100 and one second refrigeration cycle 200.

The housing 9 is partitioned into an interior air passage 3 and an exterior air passage 6 by a partitioning panel 2. The interior air passage 3 takes in an interior air from an interior air suction duct 4 and discharges the air in the interior air passage 3 from an interior air discharging duct 5 to the interior. An interior blower device 7 is provided in the interior air passage 3. An interior airflow 11 of the interior air is generated in the interior air passage 3 by the interior blower device 7 along a direction from the interior air suction duct 4 toward the interior air discharging duct 5. In the present embodiment, the interior air suction duct 4 is located in an upper position, and the interior air discharging duct 5 is located in a lower position lower than the upper position. The direction of the interior airflow 11 in the interior air passage 3 is a direction from the upper position to the lower position. The air in the interior air passage 3 may flow downward.

The exterior air passage 6 takes in an exterior air and discharges the air in the exterior air passage 6 to an exterior. In the present embodiment, the exterior air passage 6 is further partitioned into a first exterior air passage 6-1 for radiating heat of the first refrigeration cycle 100 and a second exterior air passage 6-2 for radiating heat of the second refrigeration cycle 200. The first exterior air passage 6-1 is located upstream of the second exterior air passage 6-2 with respect to the direction of the interior airflow 11. In other words, the first exterior air passage 6-1 is located in the upper position, and the second exterior air passage 6-2 is located in the lower position. A first exterior blower device 8-1 is provided at a discharging port of the first exterior air passage 6-1. A second exterior blower device 8-2 is provided at a discharging port of the second exterior air passage 6-2. A first exterior airflow 12A is generated by driving the first exterior blower device 8-1 along a direction from an intake port of the first exterior air passage 6-1 toward the discharging port of the first exterior air passage 6-1. A second exterior airflow 12B is generated by driving the second exterior blower device 8-2 along a direction from an intake port of the second exterior air passage 6-2 toward the discharging port of the second exterior air passage 6-2.

The first refrigeration cycle 100 includes an evaporator (evaporation heat exchanger) 101 and a condenser (condensation heat exchanger) 102. The evaporator 101 receives heat from a high temperature air to evaporate a refrigerant in the evaporator 101. The condenser 102 causes the refrigerant therein to condense by radiating heat to a low temperature air. The first refrigeration cycle 100 further includes a gas refrigerant connection pipe 103 that guides the refrigerant evaporated in the evaporator 101 to the condenser 102 and a liquid refrigerant connection pipe 104 that returns the refrigerant condensed in the condenser 102 to the evaporator 101, and the gas refrigerant connection pipe 103 and the liquid refrigerant connection pipe 104 connect together the evaporator 101 and the condenser 102 to configure the evaporative cooling type refrigeration cycle in which the refrigerant circulates. The gas refrigerant connection pipe 103 and the liquid refrigerant connection pipe 104 may be used as an example of a first refrigerant pipe that connects the evaporator 101 and the condenser 102 to each other to configure a refrigerant cycle in which the refrigerant circulates.

The evaporator 101 of the first refrigeration cycle 100 is positioned in the interior air passage 3, and the condenser 102 of the first refrigeration cycle 100 is positioned in the exterior air passage 6-1. The gas refrigerant connection pipe 103 and the liquid refrigerant connection pipe 104 extend through the partitioning plate 2 and connect the evaporator 101 and the condenser 102 to each other.

The evaporator 101 of the first refrigeration cycle 100 is positioned upstream of the second refrigeration cycle 200 with respect to the interior airflow 11 in the interior air passage 3. In the present embodiment, the evaporator 101 is located in the upper position that is an upstream side of the interior air passage 3.

The second refrigeration cycle 200 is the vapor-compression type refrigeration cycle that includes at least a compressor 201, a condenser 202, an evaporator 203 and a decompression device 204. The compressor 201 compresses and circulates a refrigerant gas in the cycle. The condenser 202 condenses the refrigerant gas discharged from the compressor 201. The decompression device 204 decompresses and expands the refrigerant condensed in the condenser 202. The evaporator 203 evaporates the refrigerant decompressed by the decompression device 204. The compressor 201, the condenser 202, the decompression device 204 and the evaporator 203 are connected together by a refrigerant pipe (second refrigerant pipe) 205 so as to configure a refrigerant cycle in which the refrigerant or the refrigerant gas circulates.

In the integrated type air conditioning device 1, the evaporator 203 of the second refrigeration cycle 200 is positioned in the interior air passage 3, and the condenser 202 is positioned in the exterior air passage 6-2.

The evaporator 203 of the second refrigeration cycle 200 is positioned downstream of the first refrigeration cycle 100 in the interior air passage 3. In the present embodiment, the evaporator 203 is located in the lower position that is a downstream side of the interior air passage 3.

In the present embodiment, the decompression device 204 is positioned in the interior air passage 3, and the compressor 201 is positioned in the exterior air passage 6-2. However, the positions of the decompression device 204 and the compressor 201 are not essential factor of the present embodiment, and the decompression device 204 and the compressor 201 may be not necessarily disposed as shown in FIG. 1.

In the present embodiment, the condenser 102 of the first refrigeration cycle 100 is positioned in the first exterior air passage 6-1, and the condenser 202 of the second refrigeration cycle 200 is positioned in the second exterior air passage 6-2. The condenser 102 and the condenser 202 are arranged next to each other and radiate heat to the exterior air individually.

This configuration may be described as below. The first exterior air passage 6-1 forms the first exterior airflow 12A that is drawn from the exterior and discharged to the exterior after passing through the condenser 102 of the first refrigeration cycle 100. The second exterior air passage 6-2 forms the second exterior airflow 12B that is drawn from the exterior and discharged to the exterior after passing through the condenser 202 of the second refrigeration cycle 200. Discharged directions of the first and second exterior airflows 12A, 12B are set to be the same direction (to the right side in FIG. 1). Since the first exterior air passage 6-1 and the second exterior air passage 6-2 are stacked in a vertical direction, the condenser 102 of the first refrigeration cycle 100 positioned in the first exterior air passage 6-1 and the condenser 202 of the second refrigeration cycle 200 positioned in the second exterior air passage 6-2 are also arranged adjacent to each other along the vertical direction.

Plural first refrigeration cycles 100 and Plural second refrigeration cycles 200 may be provided in order to obtain a higher cooling capacity or a higher efficiency of the integrated type air conditioning device 1. FIG. 2 shows an example where two first refrigeration cycles 100 (cycle 100a and cycle 100b) and one second refrigeration cycle 200 are provided. An evaporator 101a, a condenser 102a, a gas refrigerant connection pipe 103a, and a liquid refrigerant connection pipe 104a which configure the cycle 100a, and a evaporator 101b, a condenser 102b, a gas refrigerant connection pipe 103b, and a liquid refrigerant connection pipe 104b which configure the cycle 100b have the same configurations as the evaporator 101, the condenser 102, the gas refrigerant connection pipe 103, and the liquid refrigerant connection pipe 104 shown in FIG. 1, so descriptions for those are omitted. The cycles 100a and 100b shown in FIG. 2 are regarded as one first refrigeration cycle 100 (as shown in FIG. 1) below for convenience.

A usage and actuations of the integrated type air conditioning device 1 according to the present embodiment will be described referring to FIG. 2. The integrated type air conditioning device 1 is an air conditioner that is a duct connection type and connected to an outside of a sealed casing 301 that is a target for cooling, and the interior air passage 3 and an interior of the sealed casing 301 are communicated with each other through the interior air suction duct 4 and the interior air discharging duct 5. The sealed casing 301 is a sealed facility that houses a heat generating element 302 such as an electronic device, and the sealed casing 301 is a base station for cell-phones, for example. In the present embodiment, the interior air suction duct 4 is located in the upper position compared to the interior air discharging duct 5 in the integrated type air conditioning device 1, and the integrated type air conditioning device 1 is connected to the sealed casing 301 so that the interior airflow 11 in the interior air passage 3 flows from the upper side to the lower side.

In the sealed casing 301, an exhausted heat from the heat generating element 302 is likely to accumulate in an upper position in the sealed casing 301. The integrated type air conditioning device 1 takes in the interior air into the interior air passage 3 from the upper position in the sealed casing 301 through the interior air suction duct 4.

The interior airflow 11 taken into the interior air passage 3 passes through the evaporator 101 of the first refrigeration cycle 100 at first. The interior air taken into the interior air passage 3 may pass through the evaporator 101 of the first refrigeration cycle 100 at first. The refrigerant in the evaporator 101 is vapored by heat of the interior airflow 11, and the interior airflow 11 is cooled by a latent heat of evaporation of the interior airflow 11.

The refrigerant vapored in the evaporator 101 reaches the condenser 102 located in the exterior air passage 6-1 through the gas refrigerant connection pipe 103. The refrigerant in the condenser 102 is condensed by the low temperature of the first exterior airflow 12A passing through the condenser 102, and a condensational latent heat. The refrigerant condensed in the condenser 102 is returned to the evaporator 101 through the liquid refrigerant connection pipe 104. The first exterior airflow 12A heated by passing through the condenser 102 is discharged to the exterior of the first exterior air passage 6-1 from the outflow port.

The interior airflow 11 cooled by passing through the evaporator 101 of the first refrigeration cycle 100 passes through the evaporator 203 of the second refrigeration cycle 200. When the interior airflow 11 is not cooled adequately in by the first refrigeration cycle 100, the second refrigeration cycle 200 is driven to cool the interior airflow 11 to a target temperature. The interior air cooled by passing through the evaporator 203 of the second refrigeration cycle 200 is returned to the lower position of the sealed casing 301 through the interior air discharging duct 5 and used as a heat generating element cooling air 303.

Next, effects of the integrated type air conditioning device 1 will be described.

According to the present embodiment, the evaporator 101 of the first refrigeration cycle 100 that is evaporative cooling type is located on the upstream side of the interior air passage 3, and the evaporator 203 of the second refrigeration cycle 200 is located on the downstream side of the interior air passage 3. The interior blower device 7 is disposed in the interior air passage 3, and the interior airflow 11 is generated by driving the interior blower device 7, and accordingly, heat exchanges of the first refrigeration cycle 100 and the second refrigeration cycle 200.

According to this configuration, the interior airflow 11 that has high temperature due to the exhausted heat from the heat generating element 302 is cooled by the first refrigeration cycle 100 that does not use a power of a compressor, for example, at first in the integrated type air conditioning device 1. Accordingly, when a temperature of the exterior airflow 12A, 12B is low (e.g. in winter), the interior air of the sealed casing 301 can be cooled without driving the second refrigeration cycle 200. On the other hand, when the temperature of the exterior airflow 12A, 12B is high (e.g. in summer), and when an enough cooling capacity cannot be obtained only by the first refrigeration cycle 100, the interior air of the sealed casing 301 can be cooled stably by driving the second refrigeration cycle 200 immediately. Even in this case, since the interior airflow 11 reaches the second refrigeration cycle 200 after being cooled to some extent by the first refrigeration cycle 100, a required cooling capacity of the second refrigeration cycle 200 is small compared to a case where the first refrigeration cycle 100 is not provided.

Accordingly, the integrated type air conditioning device 1 of the present disclosure can cool with saving electric power compared to an air conditioner that does not have the first refrigeration cycle 100.

Figure 3:
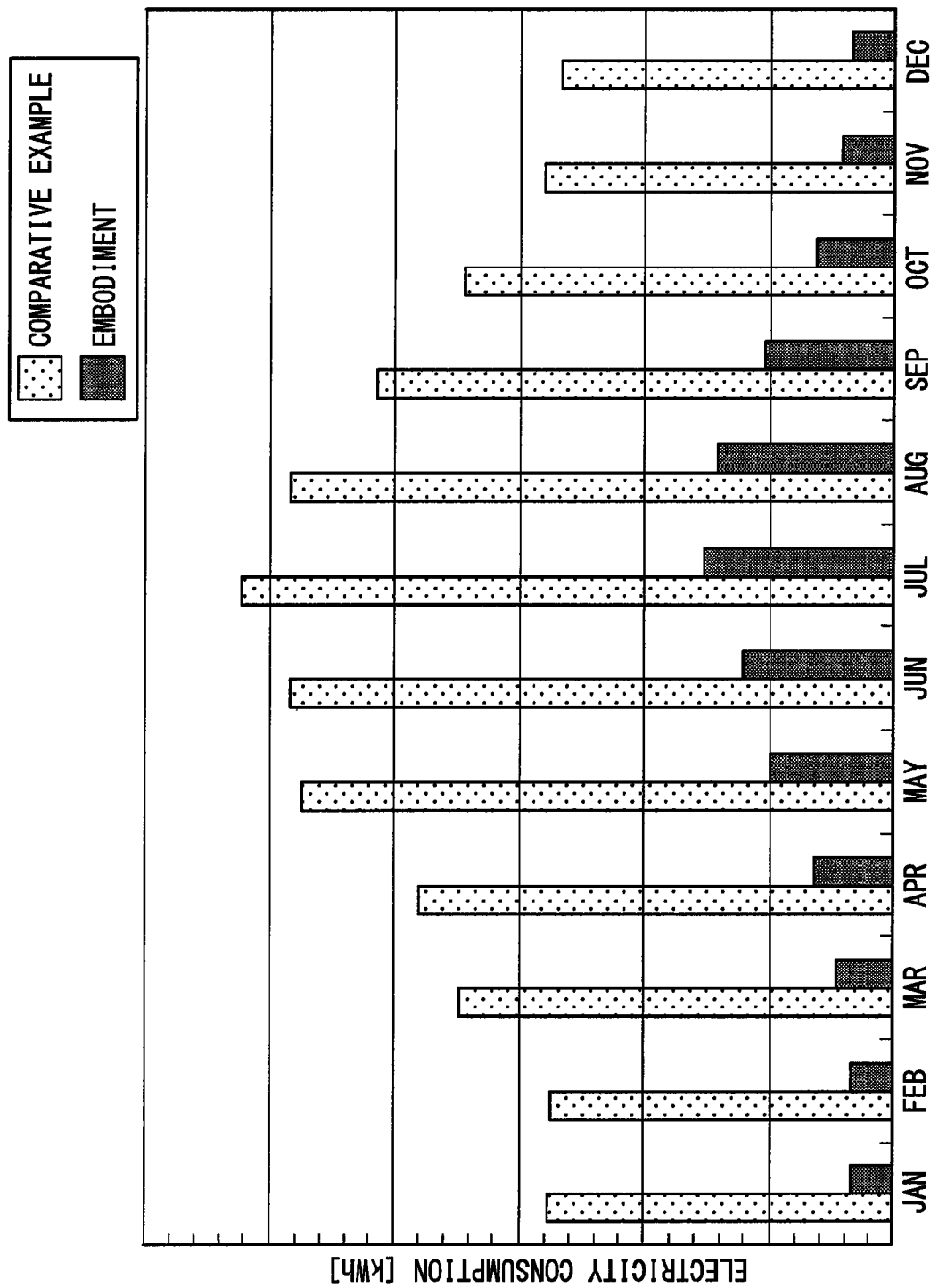
FIG. 3 is a graph comparing monthly electricity consumptions for cooling a sealed casing between the integrated type air conditioning device according to the embodiment and an air conditioner according to a comparative example.

A result of comparison of electricity consumptions for cooling the sealed casing 301 between the integrated type air conditioning device 1 of the present disclosure and an air conditioner of a comparative example that does not have the first refrigeration cycle 100 will be described referring to FIG. 3. In this comparison, several condition are set, in which an amount of heat generation in the sealed casing 301 is 30 kW, a temperature of an exhausted heat 304 from the heat generating element 302 is approximately 45° C. to 60° C., and a monthly average temperature of Tokyo, Japan is set as a temperature of the exterior air 12A, 12B. In FIG. 3, a horizontal axis represents months, and a vertical axis represents an electricity consumption (kWh). Moreover in FIG. 3, shaded bars represent monthly electricity consumptions by the integrated type air conditioning device 1 according to the present embodiment, and the dotted bars represent monthly electricity consumptions by the air conditioner of the comparative example in which an air conditioner is installed in the sealed casing 301. As shown in FIG. 3, approximately 70 to 80 percent of the electric power consumed by the air conditioner of the comparative example can be saved throughout the whole year by using the integrated type air conditioning device 1 according to the present embodiment.

In the integrated type air conditioning device 1 according to the present embodiment, first, the interior air is cooled by using the first refrigeration cycle 100 that is evaporative cooling type and consumes relatively small amount of electric power. Subsequently, a deficiency of the cooling capacity of the first refrigeration cycle 100, which may be caused by a difference between a temperature of the exterior air and a temperature of the refrigerant in the first refrigeration cycle 100, is covered by using the second refrigeration cycle 200 that is vapor-compression type, and accordingly the interior air can be cooled efficiently regardless of the temperature of the exterior air.

Moreover, in the integrated type air conditioning device 1 of the present embodiment, since the evaporator 101 of the first refrigeration cycle 100 and the evaporator 203 of the second refrigeration cycle 200 are arranged in straight along the vertical direction, both evaporators 101, 203 can use the interior blower device 7. Therefore, a power required in the driving time can be reduced compared to a case where an evaporative cooling device and an air conditioner are provided separately. Moreover, according to the present embodiment, the devices can be manufactured at low-cost.

The integrated type air conditioning device 1 of the present embodiment houses all the devices for cooling in single housing 9 including all elements of the first and second refrigeration cycle 100, 200. According to this configuration, when the integrated type air conditioning device 1 is mounted to the sealed casing 301, connection works of refrigeration pipes and filling works of the refrigerant in a place where the integrated type air conditioning device 1 is mounted to the sealed casing 301 can be omitted, and accordingly the mounting and preparing for driving of the integrated type air conditioning device 1. Therefore, inadequate connection that may occur during connection works of refrigeration pipes, leakage of the refrigerant that may occur during filling works of the refrigerant, and mistake of an amount of the refrigerant filled in the refrigerant pipe, for example may not occur.

According to the present embodiment, when the integrated type air conditioning device 1 is mounted, the housing 9 is arranged so that the interior airflow 11 to flow downward in the interior air passage 3, and the evaporator 101 of the first refrigeration cycle 100 is positioned in the upper position compared to the evaporator 203 of the second refrigeration cycle 200. Since the interior air flows downward in the interior air passage 3 from the upper part of the housing 9, the interior air can be drawn into the housing 9 from an upper part of the sealed casing 301 in which the exhausted heat 304 exhausted from the heat generating element in the sealed casing 301 is likely to accumulate, and accordingly the interior of the sealed casing 301 can be cooled effectively.

In the present embodiment, since the evaporator 101 of the first refrigeration cycle 100 and the evaporator 203 of the second refrigeration cycle 200 are arranged in straight along up-down direction, a condensed water generated on a surface of the evaporator 101 of the first refrigeration cycle 100 passes nearby the evaporator 203 of the second refrigeration cycle 200 to be gathered in a drain pan positioned below the evaporator 203 of the second refrigeration cycle 200, and the condensed water is promptly drained through a drain passage. Accordingly, drain pans and drain passage for each evaporator are not needed, and a configuration of the integrated type air conditioning device 1 can be simple.

Figure 2:
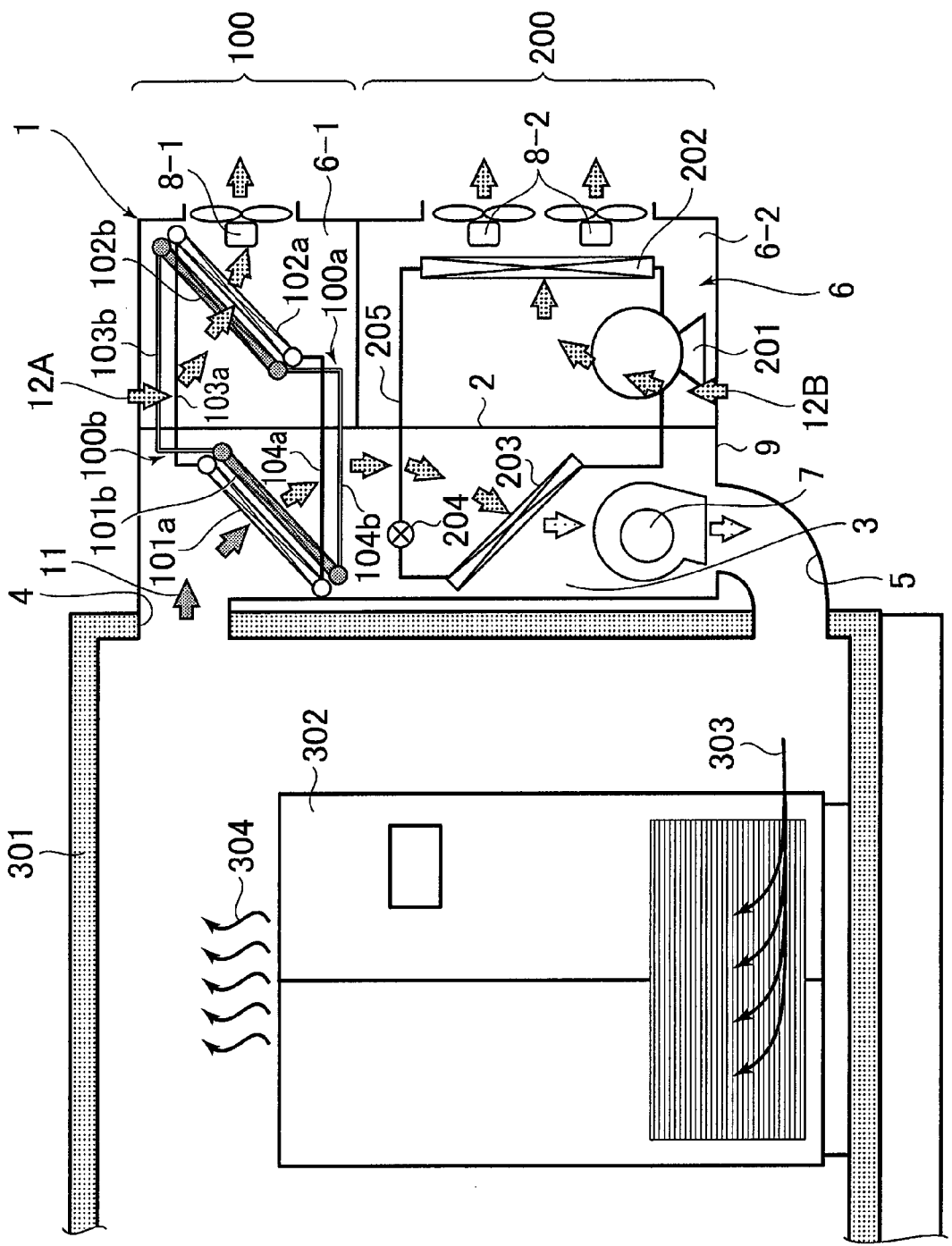
FIG. 2 is a diagram illustrating the integrated type air conditioning device mounted to a sealed casing, according to the embodiment.

Moreover, as shown in FIGS. 1 and 2, the evaporator 101 of the first refrigeration cycle 100 and the evaporator 203 of the second refrigeration cycle 200 are arranged so that the direction of the interior airflow 11 and a direction in which the condensed water generated on the surfaces of the evaporators 101, 203 during cooling time is drained are approximately same. Accordingly, when the condensed water is generated on the surfaces of the evaporators 101, 203, the condensed water is promptly drained, and accordingly a decrease of a flow amount of the interior airflow 11 due to an increase of ventilation resistance caused by remaining of the condensed water on the surfaces of the evaporators 101, 203 can be limited.

Further, the condenser 102 of the first refrigeration cycle 100 is positioned in the first exterior air passage 6-1, and the condenser 202 of the second refrigeration cycle 200 is positioned in the second exterior air passage 6-2. The first exterior airflow 12A that is drawn from the exterior and discharged after passing through the condenser 102 is generated in the first exterior air passage 6-1, and the second exterior airflow 12B that is drawn from the exterior and discharged after passing through the condenser 202 is generated in the second exterior air passage 6-2. According to this configuration, since the condenser 102 of the first refrigeration cycle 100 can radiate heat to an air different from an air to which the condenser 202 of the second refrigeration cycle 200 radiates, and the condenser 202 of the second refrigeration cycle 200 can radiate heat to an air different from an air to which the condenser 102 of the first refrigeration cycle 100 radiates, the condensers 102, 202 can radiate heat effectively without affected by a radiation from the other condenser.

Although the present disclosure has been fully described in connection with the preferred embodiment thereof with reference to the accompanying drawings, it is to be noted that various changes and modifications will become apparent to those skilled in the art.

Next, modifications of the integrated type air conditioning device 1 according to the above-described embodiment will be described.

Figure 4:
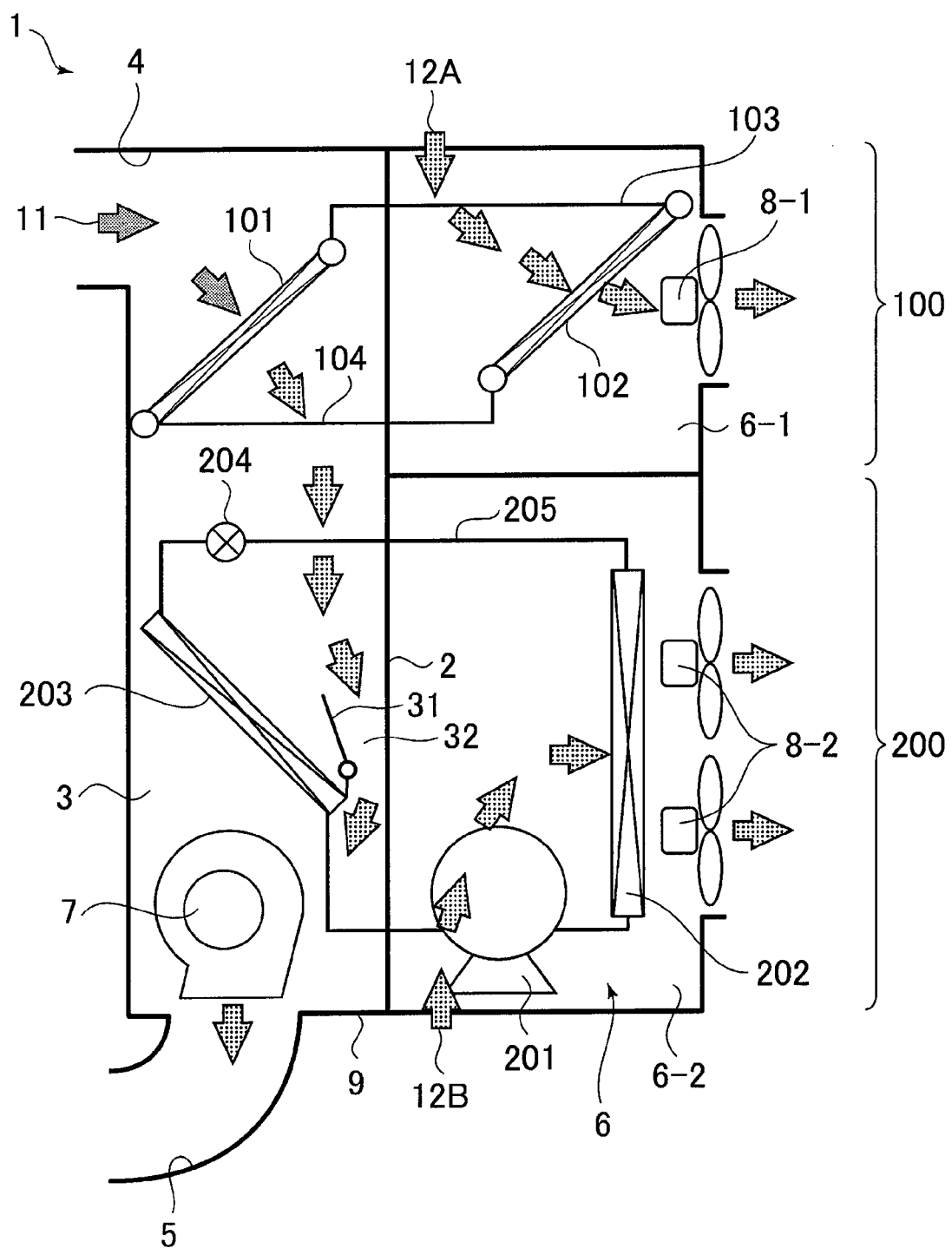
FIG. 4 is a diagram illustrating an integrated type air conditioning device according to a first modification of the first embodiment.

In the above-described embodiment, the evaporator 101 of the first refrigeration cycle 100 and the evaporator 203 of the second refrigeration cycle 200 are arranged so that the interior air flows in straight along the vertical direction in the interior air passage 3. However, a bypass passage 32 through which the interior airflow 11 bypasses the evaporator 203 of the second refrigeration cycle 200 may be provided in the interior air passage 3, and a switching damper 31 that selectively opens and closes the bypass passage 32 may be provided, as shown in FIG. 4. According to this, ventilation resistance in the interior air passage 3 can be further decreased under a condition where the interior air can be cooled without driving the second refrigeration cycle 200, and accordingly the electricity consumption during the cooling operation can be further decreased by decreasing the driving power of the interior blower device 7.

Figure 5:
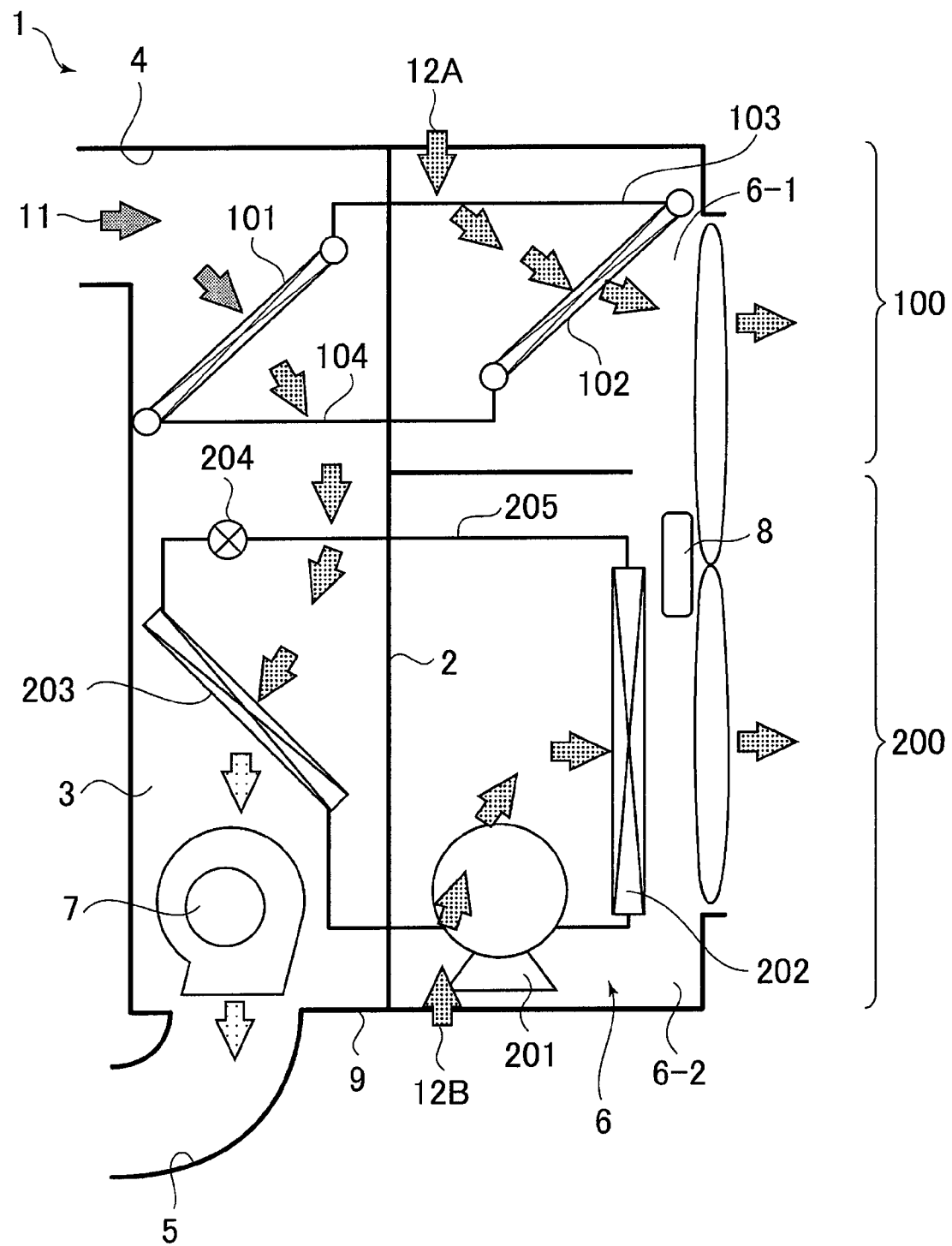
FIG. 5 is a diagram illustrating an integrated type air conditioning device according to a second modification of the first embodiment.

In the above-described embodiment, the first and second exterior blower devices 8-1, 8-2 are provided separately. The first exterior blower device 8-1 enhances heat exchange between the exterior air and the condenser 102 of the first refrigeration cycle 100. The second exterior blower device 8-2 enhances heat exchange between the exterior air and the condenser 202 of the second refrigeration cycle 200. However, single exterior blower device 8 having enough blowing capacity may be shared by the condensers 102, 202, as shown in FIG. 5. In this case, the first and second exterior airflows 12A, 12B are gathered at a common outflow port. According to this configuration, a manufacturing cost of the integrated type air conditioning device 1 can be further reduced.

Figure 6:
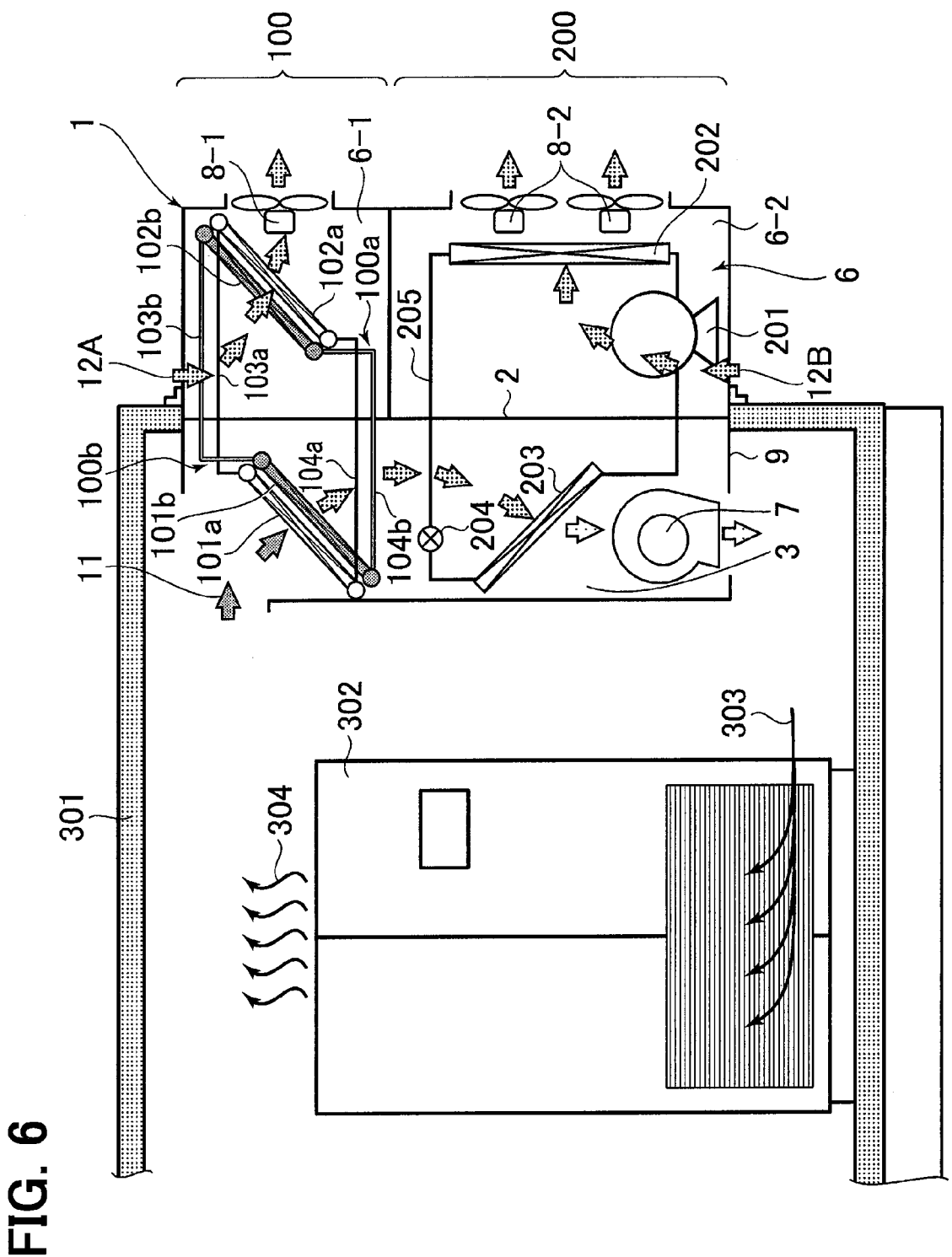
FIG. 6 is a diagram illustrating an integrated type air conditioning device mounted to a sealed casing, according to a third modification of the first embodiment.

In the above-described embodiment, the integrated type air conditioning device 1 and the sealed casing 301 are connected to each other by the interior air suction duct 4 and the exterior air discharging duct 5. However, the integrated type air conditioning device 1 and the sealed casing 301 may be integrated with each other to integrate those air conditioning capacities, as shown in FIG. 6. In this case, the integrated type air conditioning device 1 is provided in the sealed casing 301, and the exterior air passages 6-1, 6-2 communicate with the exterior of the sealed casing 301.

Figure 7:
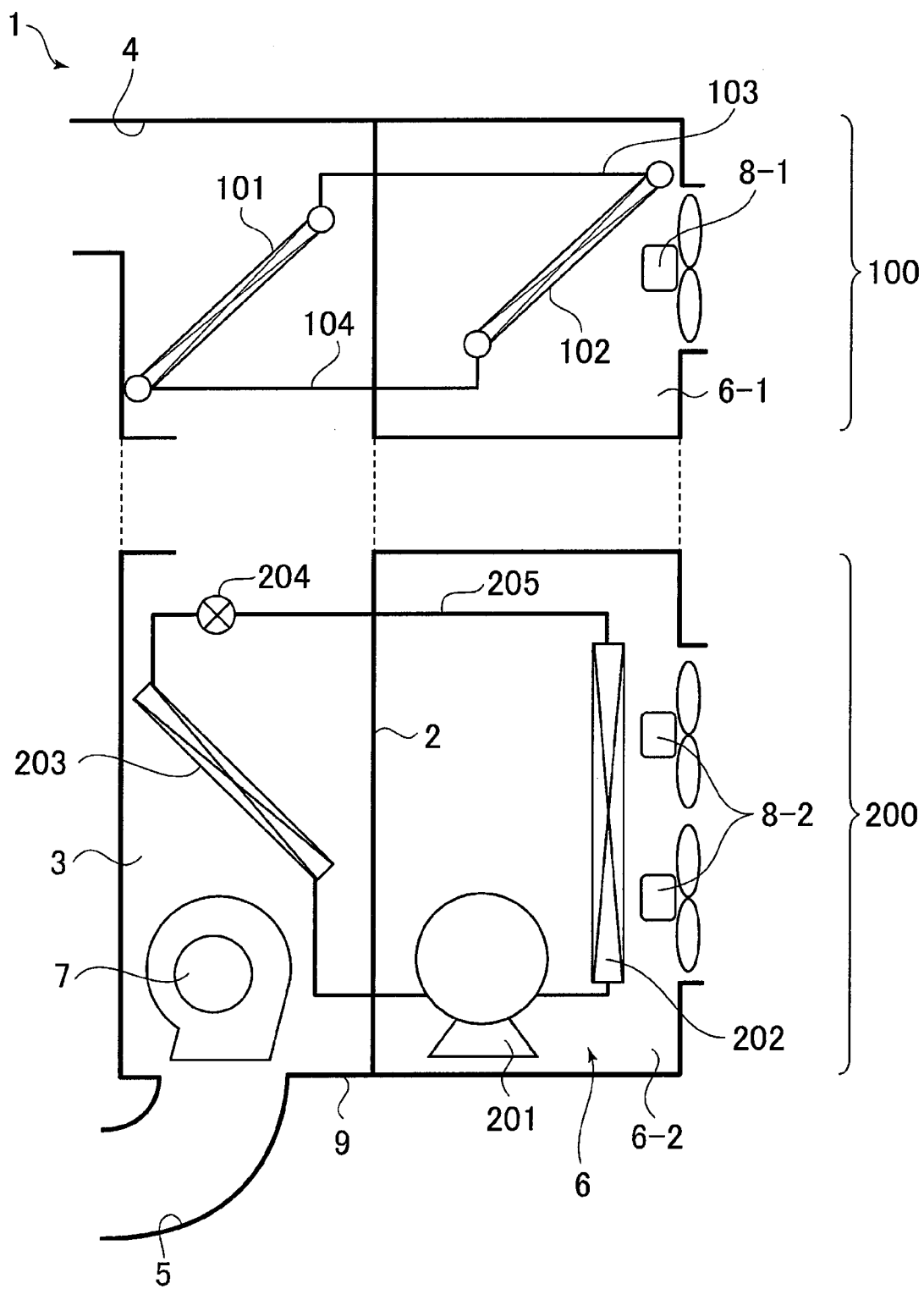
FIG. 7 is a diagram illustrating an integrated type air conditioning device according to a fourth modification of the first embodiment.

In the above-described embodiment, the first refrigeration cycle 100 and the second refrigeration cycle 200 are accommodated in the housing 9 of the integrated type air conditioning device 1. However, the integrated type air conditioning device 1 may be divided into several units, and the several units may be assembled into the integrated type air conditioning device 1, as shown in FIG. 7. In other words, the housing 9 may include several units, each of which contains a part of the inner space of the housing 9, and the interior air passage 3 and the exterior air passages 6-1, 6-2 may be formed by assembling the units.

For example, (i) the integrated type air conditioning device 1 may include an upper unit that accommodates the first refrigeration cycle 100 and a lower unit that accommodates the second refrigeration cycle 200. In this case, the upper unit and the lower unit are joined to complete the integrated type air conditioning device 1. (ii) The integrated type air conditioning device 1 may include an interior unit that defines the interior air passage 3 and an exterior unit that defines the exterior air passages 6-1 and 6-2. In this case, the interior unit and the exterior unit are joined to complete the integrated type air conditioning device 1. (iii) The integrated type air conditioning device 1 may include separations of both above-described (i) and (ii), and four units may be joined to complete the integrated type air conditioning device 1.

Additional advantages and modifications will readily occur to those skilled in the art. The disclosure in its broader terms is therefore not limited to the specific details, representative apparatus, and illustrative examples shown and described.

In the above-described embodiment, the first exterior air passages 6-1 accommodating a part of the first refrigeration cycle 100 and the second exterior air passages 6-2 accommodating a part of the second refrigeration cycle 200 are provided. However, the first and second exterior air passages 6-1, 6-2 may be single space as far as the first exterior airflow 12A passing through the condenser 102 of the first refrigeration cycle 100 and the second exterior airflow 12B passing through the condenser 202 of the second refrigeration cycle 200 are formed.

In the above-described embodiment, the first and second exterior airflow 12A, 12B are drawn from separate intake ports respectively and discharged from separate discharging ports respectively. However, at least one of the intake port and the discharging port may be shared by the first and second exterior airflow 12A, 12B as far as the first and second exterior airflow 12A, 12B are separated from each other when passing through the condenser 102 or 202.

What is claimed is:

1. An integrated type air conditioning device for cooling an interior of a room, the integrated type air conditioning device comprising:
    a first refrigeration cycle that is an evaporative cooling type;
    a second refrigeration cycle that is a vapor-compression type;
    a blower device enhancing heat exchanges in the first refrigeration cycle and the second refrigeration cycle; and
    a housing accommodating the first refrigeration cycle and the second refrigeration cycle, wherein
    the first refrigeration cycle includes:
        an evaporation heat exchanger evaporating a refrigerant therein by receiving heat of a high temperature air;
        a condensation heat exchanger condensing the refrigerant therein while radiating heat to a low temperature air; and
        a first refrigerant pipe connecting together the evaporation heat exchanger and the condensation heat exchanger to form a refrigerant circuit in which the refrigerant circulates,
    the second refrigeration cycle includes:
        a compressor compressing and circulating a gas refrigerant in the second refrigeration cycle;
        a condenser condensing the gas refrigerant discharged from the compressor;
        a decompression device decompressing and expanding the refrigerant condensed by the condenser;
        an evaporator evaporating the refrigerant decompressed by the decompression device; and
        a second refrigerant pipe connecting together the compressor, the condenser, the decompression device, and the evaporator to form a refrigerant circuit in which the refrigerant circulates, wherein
    the housing is partitioned into an interior air passage and an exterior air passage, the interior air passage taking in an air from the interior of the room and discharging the air to the interior of the room, the exterior air passage taking in an air from an exterior of the room and discharging the air to the exterior of the room, the evaporation heat exchanger of the first refrigeration cycle and the evaporator of the second refrigeration cycle are positioned in the interior air passage, the evaporation heat exchanger being located upstream of the evaporator with respect to an interior airflow in the interior air passage, the blower device is disposed in the interior air passage and is driven to generate the interior airflow in the interior air passage, the exterior air passage is partitioned by a wall into a first exterior air passage and a second exterior air passage, the condensation heat exchanger is disposed in the first exterior air passage, and the condenser is entirely disposed in the second exterior air passage.

2. The integrated type air conditioning device according to claim 1, wherein the housing is configured to form the interior airflow from an upper side to a lower side of the housing in the interior air passage when the housing is fixed, and the evaporation heat exchanger is located on an upper side of the evaporator in the interior air passage.

3. The integrated type air conditioning device according to claim 1, wherein a direction of the interior airflow in the interior air passage is same as a drainage direction of a condensed water generated on surfaces of the evaporation heat exchanger and the evaporator at a time of air cooling.

4. The integrated type air conditioning device according to claim 1, wherein the condensation heat exchanger of the first refrigeration cycle and the condenser of the second refrigeration cycle are disposed in the exterior air passage, the first exterior air passage forms therein a first exterior airflow in which an air drawn from the exterior of the room is discharged to the exterior of the room after passing through the condensation heat exchanger, and the second exterior air passage forms therein a second exterior airflow in which an air drawn from the exterior of the room is discharged to the exterior of the room after passing through the condenser.

5. The integrated type air conditioning device according to claim 4, further comprising an exterior blower device disposed in the exterior air passage and driven to generate the first and second exterior airflows.

6. The integrated type air conditioning device according to claim 4, further comprising:

a first exterior blower device disposed in the first exterior air passage and driven to generate the first exterior airflow; and a second exterior blower device disposed in the second exterior air passage and driven to generate the second exterior airflow.

7. The integrated type air conditioning device according to claim 1, further comprising:

a switching damper located in the interior air passage, wherein the switching damper opens and closes a bypass passage that bypasses the evaporator.

* * * * *